United States Patent [19]
Chou

[11] Patent Number: 5,994,734
[45] Date of Patent: Nov. 30, 1999

[54] MODIFIED GATE STRUCTURE FOR NON-VOLATILE MEMORY AND ITS METHOD OF FABRICATING THE SAME

[75] Inventor: Kuo-Yu Chou, Hsinchu Hsien, Taiwan

[73] Assignee: Winbond Electronics Corp., Hsinchu, Taiwan

[21] Appl. No.: 09/120,490

[22] Filed: Jul. 21, 1998

[51] Int. Cl.[6] .................................................. H01L 29/788
[52] U.S. Cl. ........................ 257/316; 257/411; 257/412
[58] Field of Search .................................... 257/316, 411, 257/412

[56] References Cited

U.S. PATENT DOCUMENTS

| | | | |
|---|---|---|---|
| 3,690,945 | 9/1972 | Kuisl | 257/411 |
| 5,619,051 | 4/1997 | Endo | 257/411 |
| 5,739,566 | 4/1998 | Ota | 257/315 |

*Primary Examiner*—Mark V. Prenty
*Attorney, Agent, or Firm*—Ladas & Parry

[57] ABSTRACT

A modified gate structure for a non-volatile memory device is formed over a substrate. The modified gate structure from bottom to top comprises a first dielectric layer, a first conductive layer, a second dielectric layer formed on said first conductive layer, a third dielectric layer, a refractory metal layer, and a second conductive layer. The third dielectric layer is made of tantalum oxide or BST, and the refractory metal layer can be made of tungsten, platinum, titanium, molybdenum, and tantalum.

28 Claims, 4 Drawing Sheets

MODIFIED GATE STRUCTURE FOR NON-VOLATILE MEMORY AND ITS METHOD OF FABRICATING THE SAME

BACKGROUND OF THE INVENTION

1. Field of the Invention

The present invention relates to semiconductor integrated circuit fabrication technology. More particularly, the present invention relates to a modified gate structure for non-volatile memory and its method of fabricating the same.

2. Description of the Related Art

Non-volatile memory devices have been widely applied in electrical appliances, computers, instruments, etc., on account of a programmable facility and static storage after power-off FIG. 1 schematically a conventional gate structure of a non-volatile memory in a cross-sectional view. In the drawing, reference numeral 10 designates a semiconductor substrate. A first silicon dioxide layer 12 having a thickness of about 80~200 Å and a dielectric constant of about 3.9 is formed on the substrate 10 on which a first polysilicon layer 13 is deposited as a floating gate of a non-volatile memory device. Then, an O/N/O layer 14 is formed on the first polysilicon layer 13. For example, the O/N/O layer 14 is configured with a three-layer structure comprising a second silicon dioxide layer of about 50 Å, a silicon nitride layer of about 200 Å, and a third silicon dioxide layer of about 50 Å. Then, a second polysilicon layer 19 is deposited on the O/N/O layer 14 to be a control gate of the non-volatile memory device.

FIG. 2 schematically depicts an equivalent circuit diagram of the conventional gate structure pertaining to capacitive elements as shown FIG. 1, wherein the substrate 10 is grounded. In FIG. 2, $C_1$ represents the capacitance between the control gate 19 and the floating gate 13, $C_2$ represents the capacitance between the floating gate 13 and the substrate 10, and both are connected in series. $V_1$ designates an voltage applied to the control gate, which is coupled to the floating gate 13 through the capacitance $C_1$ as a voltage $V_2$, wherein $V_2=[C_1/(C_1+C_2)]V_1$. Accordingly, the applying voltage $V_1$ should be so high enough that the coupled voltage $V_2$ is able to induce electrons injection by means of tunneling effect into the floating gate 13.

General speaking, a non-volatile memory device with the conventional gate structure depicted in FIG. 1 should be powered by quite a high applying voltage $V_1$ (e.g., 12 V or more) inconvenient for circuit designers and users.

To lower the desired applying voltage $V_1$, but sustain enough coupled voltage $V_2$ for inducing tunneling effect, increasing of the capacitance $C_1$ is a feasible approach. Usually, two ways are utilized to increase the capacitance $C_1$ by: (1) increasing the capacitance area and (2) replacing the O/N/O with high dielectric constant material such as tantalum oxide ($Ta_2O_5$) or BST ($BaSrTiO_3$). However, the former will consume additional layout area which is unfavorable to integrated circuit miniaturization. The latter may deteriorate tantalum oxide ($Ta_2O_5$) or BST while generally subjected to an annealing treatment after the formation of tantalum oxide or BST wherein oxygen contained therein may react with silicon to form silicon dioxide. Furthermore, reducing gas such as nitrogen employed during the subsequent processes causes tantalum oxide or BST defects through which a leakage current flows.

SUMMARY OF THE INVENTION

It is therefore an object of the present invention to provide a modified gate structure for a non-volatile memory device, which can avert the formation of silicon dioxide during an annealing treatment subjecting to tantalum oxide or BST.

It is another object of the present invention to provide a modified gate structure for a non-volatile memory device which can keep tantalum oxide or BST from exposing reducing gas used during subsequent processes without suffering from leakage.

The present invention achieves the above-indicated objects by providing a modified gate structure formed over a substrate. The modified gate structure from bottom to top comprises a first dielectric layer, a first conductive layer, a second dielectric layer formed on said first conductive layer, a third dielectric layer, a refractory metal layer, and a second conductive layer. The third dielectric layer is made of tantalum oxide or BST, and the refractory metal layer can be made of tungsten, platinum, titanium, molybdenum, and tantalum.

According to the present invention, the modified gate structure for a non-volatile memory device makes use of the second and third dielectric layers to acquire higher effective dielectric constant as compared with that of the conventional O/N/O material. Therefore, the corresponding capacitance can be greatly increased to lower the required applying voltage. Moreover, the second dielectric layer acts as a leakage barrier, and further the refractory metal layer is used to protect the tantalum oxide or BST from deterioration as well as invasion of reducing gas during subsequent processes.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 1:
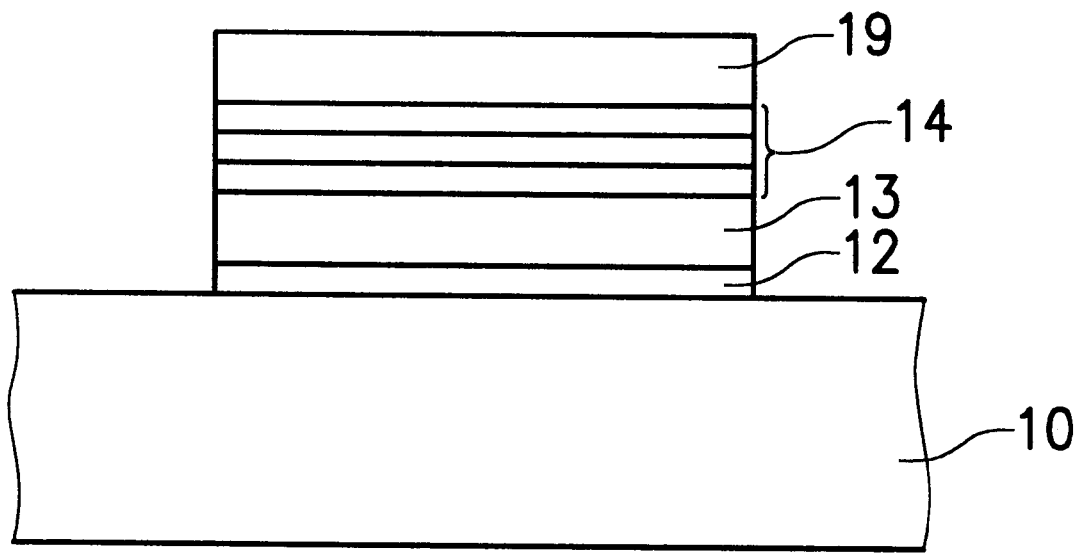
FIG. 1 schematically a conventional gate structure of a non-volatile memory in a cross-sectional view.
Figure 2:
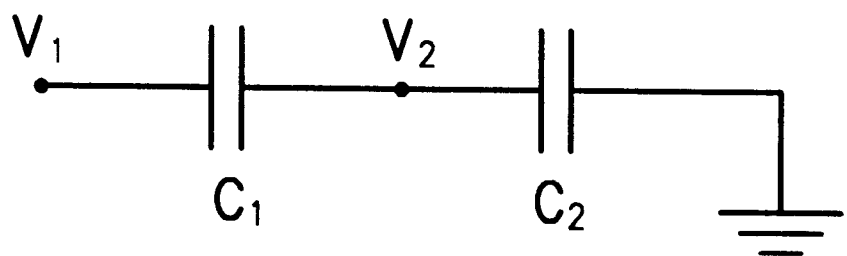
FIG. 2 schematically depicts an equivalent circuit diagram of the conventional gate structure pertaining to capacitive elements as shown FIG. 1.
Figure 3A:
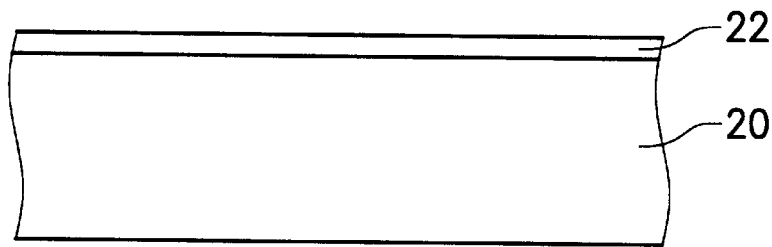
FIGS. 3A–3G schematically depicts the process flow of manufacturing a gate structure of one preferred embodiment in accordance with the present invention.
Figure 3B:
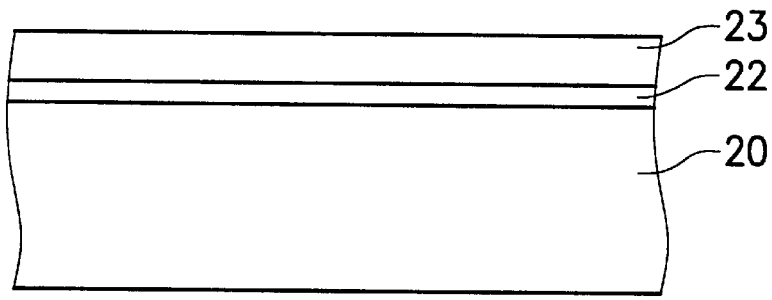

FIGS. 3A–3G schematically depicts the process flow of manufacturing a gate structure of one preferred embodiment in accordance with the present invention. However, a drain region and a source region have been omitted from the drawings because the present invention emphasizes the gate structure of the non-volatile memory device. The following will describe the process flow of forming a gate structure in detail in conjunction with the accompanying FIGS. 3A–3G First, referring to FIG. 3A, a first dielectric layer 22 is formed on a substrate 20. Preferably, the first dielectric layer 22 is a thermally-grown silicon dioxide, having a thickness of about 80~200 Å and a dielectric constant of about 3.9, while the substrate 20 is a silicon substrate. Sequentially, as shown in FIG. 3B, a first conductive layer 23 is formed to cover the first dielectric layer 22. Preferably, the first conductive layer 23 is a CVD-deposited polysilicon layer or amorphous silicon layer.

Figure 3C:
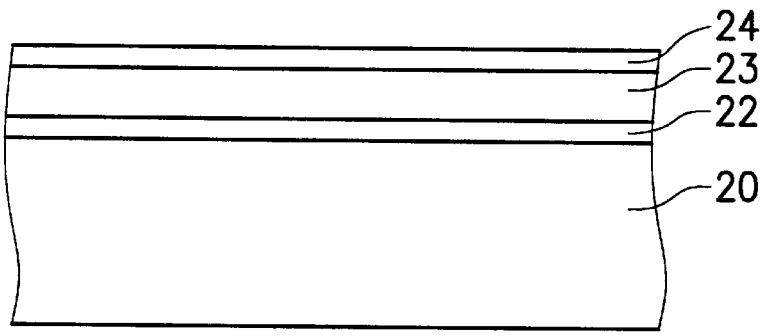
Figure 3D:
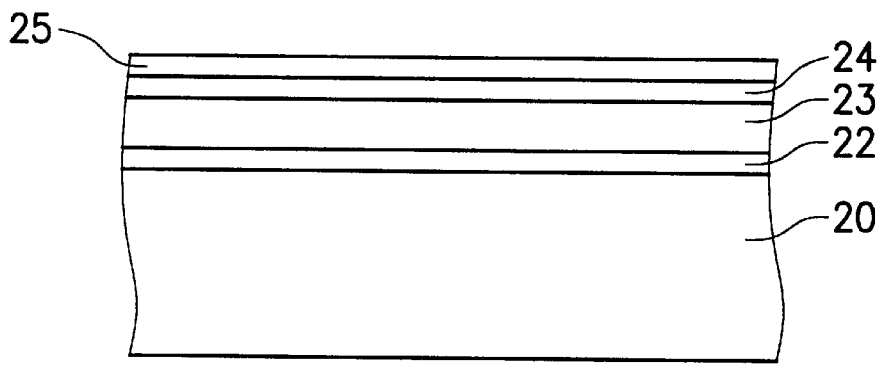

Then, referring to FIG. 3C, a second dielectric layer 24 is formed on the first conductive layer 23. Preferably, the second dielectric layer 24 is a thermally-grown or CVD-deposited silicon dioxide layer having a thickness of about 20~50 Å and a dielectric constant of about 3.9. Thereafter, a third dielectric layer 25 is formed on the second dielectric layer 24 as shown in FIG. 3D. Preferably, the third dielectric layer 25 is provided with a dielectric constant greater than that of silicon dioxide or silicon nitride. For instance, the third dielectric layer 25, having a thickness of about 200~300 Å, may be made of tantalum oxide (dielectric constant is about 25) or BST (dielectric constant is about 100) formed by means of chemical vapor deposition or physical vapor deposition.

Figure 3E:
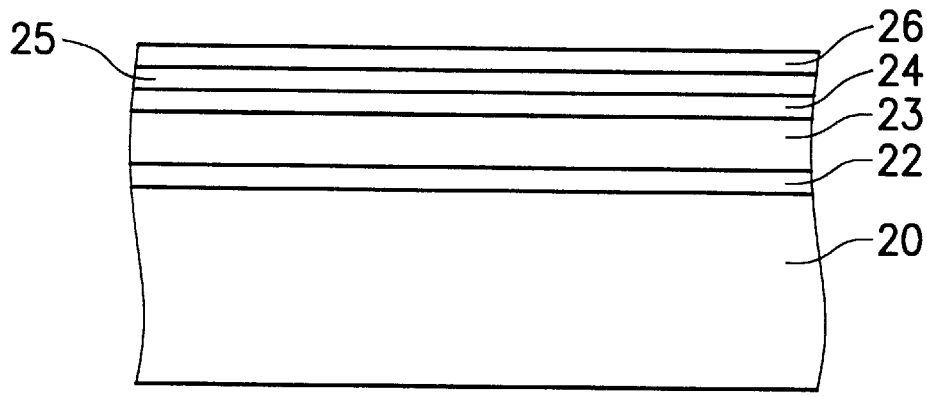
Figure 3F:
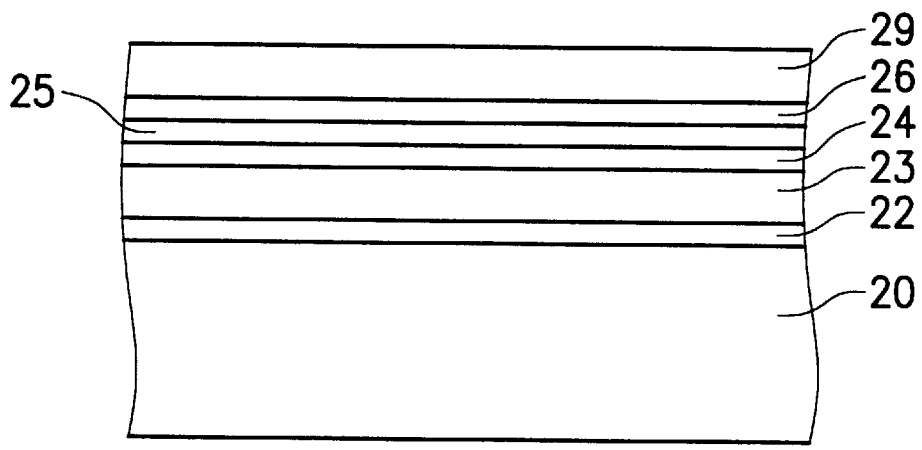

Next, as shown in FIG. 3E, a refractory metal layer 26 is formed on the third dielectric layer 25. Preferably, the refractory metal layer 26 can be made of tungsten, platinum, titanium, molybdenum, or tantalum. After that, an annealing treatment is performed to make the third dielectric layer 25 to be provided with a high dielectric constant. Moreover, a second conductive layer 29 is formed on the refractory metal layer 26, and, preferably, is a CVD-deposited polysilicon or amorphous silicon layer. Then, the second conductive layer 29, the refractory metal layer 26, the third dielectric layer 25, the second dielectric layer 24, the first conductive layer 23, and the first dielectric layer 22 are sequentially patterned and etched to formed a gate 30 by means of photolithography and, for example, plasma etching processes.

Figure 3G:
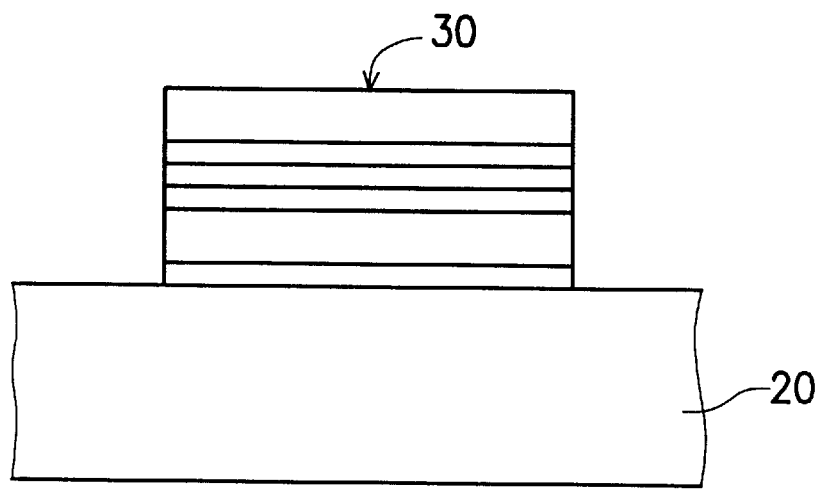
Figure 4A:
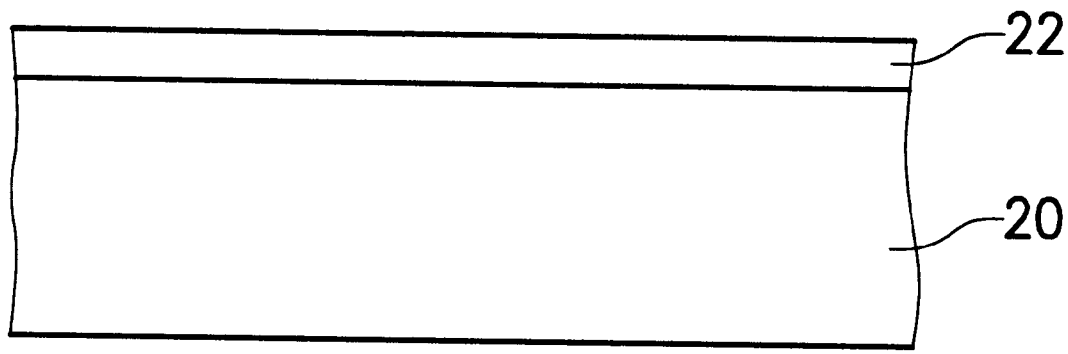
FIGS. 4A–4B schematically depicts the process flow of manufacturing a gate structure of another preferred embodiment in accordance with the present invention.
Figure 4B:
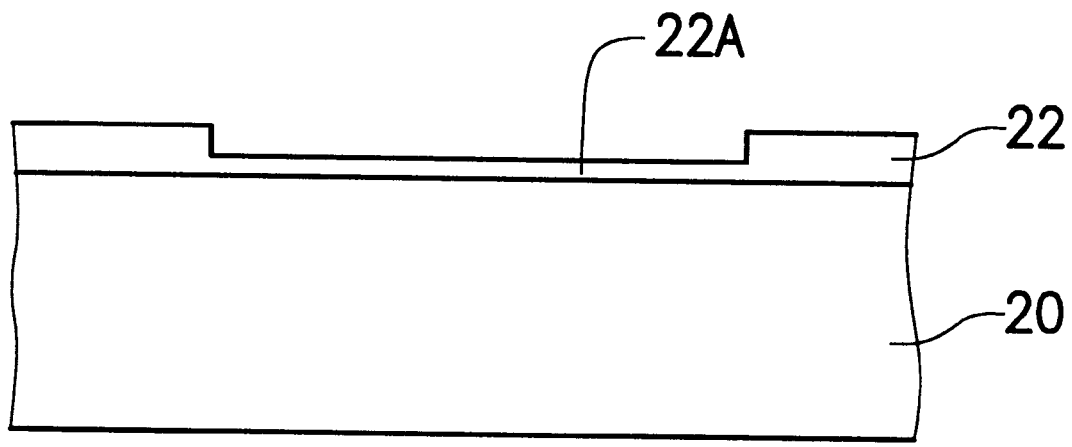

Referring to FIGS. 4A-4B, the process flow of a gate structure for a non-volatile memory device of one preferred embodiment of the present invention is schematically depicted. First, as shown in FIG. 4A, a first dielectric layer 22, preferably, a thermally-grown silicon dioxide layer, is formed to cover the substrate 20 and having a thickness of about 600~800 Å. Then, a portion of the first dielectric layer 22 within the extent of the gate 30 (as shown in FIG. 3G) is thinned by means of photolithography and etching to form a local thinner portion 22A having a thickness of about 80~200 Å as shown in FIG. 4B. Accordingly, the capacitance $C_2$ between the floating gate 23 and the substrate 20 can be decreased so as to lower the applying voltage $V_1$. However, the subsequent process steps are all similar to those depicted in FIGS. 3B~3G and have been omitted without redundancy.

According to the present invention, the modified gate structure for a non-volatile memory device makes use of silicon dioxide/tantalum oxide or silicon dioxide/BST two-layer structure so that effective dielectric constants are high up to 13.1 and 19.5, respectively, as compared with the conventional O/N/O layer (a silicon dioxide layer of about 50 Å, a silicon nitride layer of about 200 Å, and another silicon dioxide layer of about 50 Å) of about 5.7. Therefore, the corresponding capacitance $C_1$ can be greatly increased to lower the required applying voltage $V_1$. Moreover, the second dielectric layer 24 acts as a barrier to avoid leakage, and further the refractory metal layer 25 is used to protect the tantalum oxide or BST from deterioration as well as invasion of reducing gas during subsequent processes.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. A modified gate structure formed over a substrate, comprising:

a first dielectric layer formed on said substrate;

a first conductive layer formed on said first dielectric layer;

a second dielectric layer formed on said first conductive layer, wherein said second dielectric layer is a silicon oxide layer;

a third dielectric layer formed on said second dielectric layer, wherein said third dieletric layer comprises tantalum oxide or BST;

a refractory metal layer formed on said third dielectric layer; and a second conductive layer formed on said refractory metal layer, wherein said second conductive layer comprises polysilicon or amorphous silicon.

2. The modified gate structure as claimed in claim 1, wherein said first dielectric layer is a silicon oxide layer.

3. The modified gate structure as claimed in claim 1, wherein said first conductive layer comprises polysilicon or amorphous silicon.

4. The modified gate structure as claimed in claim 1, wherein said refractory metal is selected from a group consisting of tungsten, platinum, titanium, molybdenum, and tantalum.

5. A method of fabricating the modified gate structure as claimed in claim 1, the method comprising the following steps of:

providing the substrate;

forming the first dielectric layer on the substrate;

forming the first conductive layer on the first dielectric layer;

forming the second dielectric layer on the first conductive layer, wherein the second dielectric layer is a silicon oxide layer;

forming the third dielectric layer on the second dielectric layer, the third dielectric layer comprising tantalum oxide or BST;

forming the refractory metal layer on the third dielectric layer; and forming the second conductive layer on the refractory metal layer, wherein said second conductive layer comprises polysilicon or amorphous silicon.

6. The method as claimed in claim 5, wherein said first dielectric layer is a silicon oxide layer.

7. The method as claimed in claim 5, wherein said first conductive layer comprises polysilicon or amorphous silicon.

8. The method as claimed in claim 5, wherein said refractory metal layer is selected from a group consisting of tungsten, platinum, titanium, molybdenum, and tantalum.

9. The method as claimed in claim 8, further comprising a step of subjecting the third dielectric layer to an annealing treatment after the step of forming the refractory metal layer.

10. A modified gate structure formed over a substrate, comprising:

a first dielectric layer formed on said substrate;

a first conductive layer formed on said first dielectric layer;

a second dielectric layer formed on said first conductive layer;

a third dielectric layer formed on said second dielectric layer, wherein said third dieletric layer comprises tantalum oxide or BST;

a refractory metal layer formed on said third dielectric layer; and a second conductive layer formed on said refractory metal layer, wherein said second conductive layer comprises polysilicon or amorphous silicon.

11. A modified gate structure as claimed in claim 10, wherein said first dielectric layer is a silicon oxide layer.

12. A modified gate structure as claimed in claim 10, wherein said first conductive layer comprises polysilicon or amorphous silicon.

13. A modified gate structure as claimed in claim 10, wherein said first conductive layer comprises polysilicon or amorphous silicon; wherein said second dielectric layer is a silicon oxide layer; and wherein said refractory metal is selected from a group consisting of tungsten, platinum, titanium, molybdenum, and tantalum.

14. A modified gate structure as claimed in claim 10, wherein said refractory metal is selected from a group consisting of tungsten, platinum, titanium, molybdenum, and tantalum.

15. A method of fabricating the modified gate structure as claimed in claim 10, the method comprising the following steps of:

providing the substrate;

forming the first dielectric layer on the substrate;

forming the first conductive layer on the first dielectric layer;

forming the second dielectric layer on the first conductive layer;

forming the third dielectric layer on the second dielectric layer, the third dielectric layer comprising tantalum oxide or BST;

forming the refractory metal layer on the third dielectric layer; and forming the second conductive layer on the refractory metal layer, wherein said second conductive layer comprises polysilicon or amorphous silicon.

16. A method as claimed in claim 15, wherein said first and second dielectric layers are silicon oxide layers; and wherein said first conductive layer comprises polysilicon or amorphous silicon.

17. A method as claimed in claim 15, wherein said first conductive layer comprises polysilicon or amorphous silicon.

18. A method as claimed in claim 15, wherein said refractory metal layer is selected from a group consisting of tungsten, platinum, titanium, molybdenum, and tantalum.

19. A method as claimed in claim 15, further comprising a step of subjecting the third dielectric layer to an annealing treatment after the step of forming the refractory metal layer.

20. A modified gate structure as claimed in claim 1, wherein said first dielectric layer is a silicon oxide layer; wherein said first conductive layer comprises polysilicon or amorphous silicon; and wherein said refractory metal is selected from a group consisting of tungsten, platinum, titanium, molybdenum, and tantalum.

21. A modified gate structure as claimed in claim 10, wherein said first dielectric layer is a silicon oxide layer; wherein said first conductive layer comprises polysilicon or amorphous silicon; and wherein said refractory metal is selected from a group consisting of tungsten, platinum, titanium, molybdenum, and tantalum.

22. A modified gate structure as claimed in claim 1, wherein said second dieletric layer is a silicon dioxide layer.

23. A modified gate structure as claimed in claim 10, wherein said second dieletric layer is a silicon dioxide layer.

24. A modified gate structure formed over a substrate, comprising:

a first dielectric layer formed on said substrate;

a first conductive layer formed on said first dielectric layer;

a second dielectric layer formed on said first conductive layer, wherein said second dielectric layer is a silicon oxide layer;

a third dielectric layer formed on said second dielectric layer, wherein said third dieletric layer comprises tantalum oxide or BST;

a refractory metal layer formed on said third dielectric layer; and a second conductive layer formed on said refractory metal layer;

wherein said first dielectric layer is a silicon dioxide layer having a thickness of about 80–200 Å; wherein said second dieletric layer is a silicon dioxide layer having a thickness of about 20–50 Å; and wherein said third dielectric layer has a thickness of about 200–300 Å.

25. A modified gate structure as claimed in claim 11, wherein said first dielectric layer is a silicon dioxide layer having a thickness of about 80–200 Å; wherein said second dieletric layer is a silicon dioxide layer having a thickness of about 20–50 Å; and wherein said third dielectric layer has a thickness of about 200–300 Å.

26. A modified gate structure as claimed in claim 20, wherein said first dielectric layer is a silicon dioxide layer having a thickness of about 80–200 Å; wherein said second dieletric layer is a silicon dioxide layer having a thickness of about 20–50 Å; and wherein said third dielectric layer has a thickness of about 200–300 Å.

27. A modified gate structure as claimed in claim 21, wherein said first dielectric layer is a silicon dioxide layer having a thickness of about 80–200 Å; wherein said second dieletric layer is a silicon dioxide layer having a thickness of about 20–50 Å; and wherein said third dielectric layer has a thickness of about 200–300 Å.

28. A modified gate structure as claimed in claim 14, wherein said first dielectric layer is a silicon oxide layer; and wherein said second dielectric layer is a silicon oxide layer.

* * * * *